(12) United States Patent
Cranford, Jr. et al.

(10) Patent No.: US 8,051,340 B2
(45) Date of Patent: *Nov. 1, 2011

(54) SYSTEM AND METHOD FOR BALANCING DELAY OF SIGNAL COMMUNICATION PATHS THROUGH WELL VOLTAGE ADJUSTMENT

(75) Inventors: Hayden C. Cranford, Jr., Cary, NC (US); Josep A. Iadanza, Hinesburg, VT (US); Sebastian T. Ventrone, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 700 days.

This patent is subject to a terminal disclaimer.

(21) Appl. No.: 12/136,359

(22) Filed: Jun. 10, 2008

(65) Prior Publication Data

US 2008/0240222 A1 Oct. 2, 2008

Related U.S. Application Data

(63) Continuation of application No. 10/906,343, filed on Feb. 15, 2005, now Pat. No. 7,404,114.

(51) Int. Cl.
*G01R 31/28* (2006.01)
(52) U.S. Cl. ........................ 714/712; 714/715; 714/724
(58) Field of Classification Search .................. 716/114; 331/96; 327/270, 276, 277; 714/715, 724, 714/712
See application file for complete search history.

(56) References Cited

U.S. PATENT DOCUMENTS

| | | | |
|---|---|---|---|
| 3,956,709 A * | 5/1976 | Osakabe et al. ........... 330/124 R |
| 5,121,014 A | 6/1992 | Huang | |
| 5,920,222 A | 7/1999 | Eustis et al. | |
| 5,954,821 A | 9/1999 | Young | |
| 6,011,732 A | 1/2000 | Harrison et al. | |
| 6,219,822 B1 | 4/2001 | Gristede et al. | |
| 6,285,229 B1 * | 9/2001 | Chu et al. ........................ 327/277 |
| 6,366,149 B1 * | 4/2002 | Lee et al. ........................ 327/276 |
| 6,404,243 B1 | 6/2002 | Koch, II et al. | |
| 6,448,840 B2 | 9/2002 | Kao et al. | |
| 6,529,085 B2 * | 3/2003 | Hajimiri et al. ................. 331/96 |
| 6,550,045 B1 * | 4/2003 | Lu et al. ........................ 716/114 |
| 6,653,890 B2 | 11/2003 | Ono et al. | |

(Continued)

FOREIGN PATENT DOCUMENTS

WO 0252747 A1 7/2002

*Primary Examiner* — David Ton

(74) *Attorney, Agent, or Firm* — Cantor Colburn LLP; David Cain

(57) ABSTRACT

A method of balancing signal interconnect path delays between an analog domain and a digital domain of an integrated circuit includes applying a test signal to a selected one of a plurality of communication paths between the analog domain and the digital domain. A rising edge delay and a falling edge delay of the test signal is equalized by adjusting a body bias voltage of a delay element configured within the selected communication path. A rising edge delay and a falling edge delay for each of the remaining communication paths is compared with the equalized rising edge delay and falling edge delay of the selected communication path, and a body bias voltage for one or more of a plurality of delay elements configured within each of the remaining communication paths is adjusted until corresponding rising and falling edge delays thereof match the equalized rising edge delay and falling edge delay of the selected communication path.

12 Claims, 3 Drawing Sheets

U.S. PATENT DOCUMENTS

| | | |
|---|---|---|
| 6,703,879 B2 | 3/2004 | Okuda et al. |
| 6,737,901 B2 * | 5/2004 | Hein et al. ............... 327/270 |
| 7,073,145 B2 * | 7/2006 | Fry et al. ............... 716/114 |
| 7,134,062 B2 | 11/2006 | Yan |
| 7,212,695 B2 | 5/2007 | Kasper et al. |
| 2002/0005750 A1 | 1/2002 | Kao et al. |

* cited by examiner

SYSTEM AND METHOD FOR BALANCING DELAY OF SIGNAL COMMUNICATION PATHS THROUGH WELL VOLTAGE ADJUSTMENT

CROSS-REFERENCE TO RELATED APPLICATION

This application is a continuation of U.S. patent application Ser. No. 10/906,343, filed Feb. 15, 2005, now U.S. Pat. No. 7,404,114, the disclosure of which is incorporated by reference herein in its entirety.

BACKGROUND

The present invention relates generally to computer system delay elements, and, more particularly, to a system and method for balancing delay of signal communication paths through well voltage adjustment.

As technology continues to advance at an unprecedented rate, the transfer of information or data has remained a high priority. In addition, as processing speeds continue to increase, the speed at which information is transferred remains key in increasing overall system speed. Traditionally, parallel busses or cables have been coupled between multiple devices to transfer information during a processing function. However, certain problems that may degrade the transferred data (such as signal loss when transmitted over long distances) have led to improvements in the manner in which such data is transferred. In addition, the multitude of wires or cables necessary for parallel connection may become cumbersome, especially in larger systems. In the past, however, alternatives to parallel connections often led to information bottlenecks, leaving parallel lines as the only viable choice.

As the need for bandwidth expands in both existing networks and those now being developed, serial backplanes (or busses) have become an advantageous alternative for solving these problems. Typically, serial backplanes employ a serializer at a transmitting end to convert and transmit data in serial order and a deserializer at a receiving end to convert the data back to parallel form once received. Such high-speed serializer/deserializer (SERDES) receivers have become the benchmark for asynchronous communication and have provided clear advantages over parallel busses. For example, SERDES receivers include transmitters and receivers, and use simplified wiring harnesses (often only a single wire per channel) that typically consume less power than their parallel-coupled counterparts. Higher performance may also be achieved because SERDES receivers reduce the cross talk that often occurs between parallel wires. In addition, SERDES receivers may be employed to transmit data over long distances without the signal degradation experienced with parallel busses, thus ultimately offering increased reliability and fidelity over parallel busses.

SERDES receivers and transmitters generally classified as mixed-signal devices are comprised of an analog function domain, a digital function domain and a parallel communication path between the analog and digital function domains. The analog domain operates to transmit and receive data over a physical medium or cable, as well as convert between serial and parallel data at high speed, while the digital domain pre or post processes data. Reliable operation of the SERDES device at high speed is dependent not only on the function of the analog and digital domains, but on the parallel communication path that connects these domains. As a result, delay matching of all data path segments that make up the parallel path is required.

Conventionally, the matching of parallel data paths between analog and digital domains has been implemented by using a combination of FET sizing and physical placement techniques in order to reduce the effect of process variance from path to path. However, such methods typically result in the use of larger devices and/or restrictions on the location thereof, both of which hamper physical implementation and can impact circuit speed. Additionally, these techniques do not fully cancel device-to-device variations that can grow, as a percentage of drawn device size, with advancing technologies.

The overall performance of an analog/digital design depends, in part, upon the ability to maintain the synchronous tracking of the two domains. Due to broad process variations, and without some means of better adjusting the delays between the two domains, maximum potential performance may not be obtained. Moreover, if the two domains do not track with one another over temperature and time, the tolerance of the overall system will be further reduced. Accordingly, an improved means of real time adjustment of the communication paths between the domains is desirable.

SUMMARY

The foregoing discussed drawbacks and deficiencies of the prior art are overcome or alleviated by a method of balancing signal interconnect path delays between an analog domain and a digital domain of an integrated circuit. In an exemplary embodiment, the method includes applying a test signal to a selected one of a plurality of communication paths between the analog domain and the digital domain. A rising edge delay and a falling edge delay of the test signal is equalized by adjusting a body bias voltage of a delay element configured within the selected communication path. A rising edge delay and a falling edge delay for each of the remaining communication paths is compared with the equalized rising edge delay and falling edge delay of the selected communication path, and a body bias voltage for one or more of a plurality of delay elements configured within each of the remaining communication paths is adjusted until corresponding rising and falling edge delays thereof match the equalized rising edge delay and falling edge delay of the selected communication path.

In another embodiment, a system for balancing signal interconnect path delays between an analog domain and a digital domain of an integrated circuit includes a plurality of communication paths between the analog domain and the digital domain, each of the plurality of communication paths including a tunable delay element therein, with a selected one of said communication paths configured for the application of a test signal therethrough. The system further includes a means for equalizing a rising edge delay and a falling edge delay of the test signal by adjustment of a body bias voltage of a corresponding one of the tunable delay elements within the selected communication path. A means is provided for comparing a rising edge delay and a falling edge delay for each of the remaining of the plurality of communication paths with the equalized rising edge delay and falling edge delay of said selected communication path, in addition to a means for adjusting a body bias voltage for one or more of the tunable delay elements within each of the remaining of the plurality of communication paths until corresponding rising and falling edge delays thereof match the equalized rising edge delay and falling edge delay of the selected communication path.

In still another embodiment, a method of balancing a plurality of communication path delays between an analog domain and a digital domain of an integrated circuit includes setting nominal tuning values for each of a plurality of delay elements within the plurality of parallel communication paths. The delay element for a first of the plurality of communication paths is tuned until a rising edge delay of a first test signal sent through the delay element for the first communication path equals a falling edge delay of a second test signal through the delay element for the first communication path. The remaining delay elements for the remaining communication paths are tuned so as to match the equalized rising edge delay and falling edge delay of the delay element for the first communication path.

BRIEF DESCRIPTION OF THE DRAWINGS

Referring to the exemplary drawings wherein like elements are numbered alike in the several Figures:

FIG. 3(*b*) is an exemplary a multiple stage (non-inverting) CMOS element that may also be used as a tunable delay element in the system of FIG. 2;

DETAILED DESCRIPTION

Disclosed herein is a system and method for balancing delay of signal communication paths through well voltage adjustment. Briefly stated, the present invention embodiments are configured to actively balance a plurality of signal interconnect path delays between an analog and a digital domain of an integrated circuit by balancing the rising and falling delays of a first of the interconnect paths through body bias voltage adjustment of a delay element within the first interconnect path. The rising and falling delays of the remaining interconnect paths are then adjusted after subsequent comparison to the balanced rising and falling delays of the first interconnect path.

Figure 1:
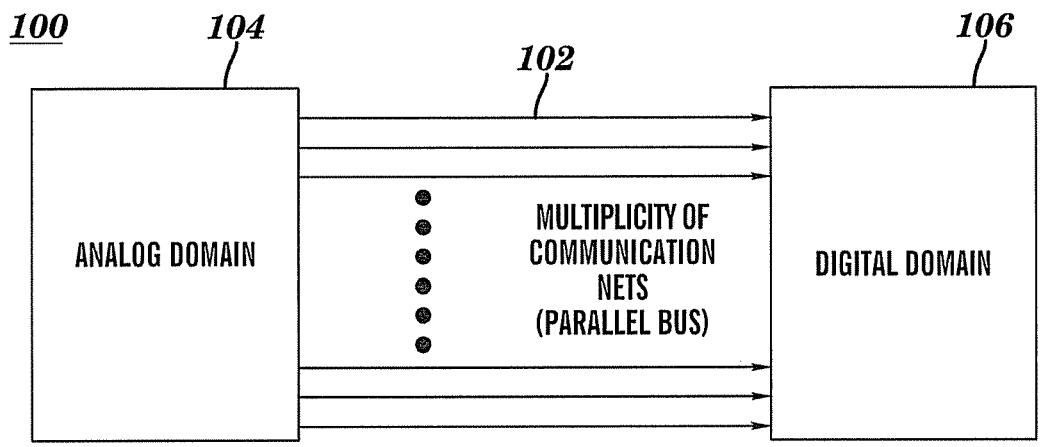
FIG. 1 is a schematic block diagram of an existing system having a multiplicity of parallel communication paths between an analog domain and a digital domain.

Referring initially to FIG. 1, there is shown a schematic block diagram of an existing system 100 having a multiplicity of parallel communication paths 102 between an analog domain 104 and a digital domain 106. As indicated above, the matching of transferred parallel data from the analog domain 104 to the digital domain 106 has previously been implemented by using a combination of FET sizing and physical placement techniques.

Figure 2:
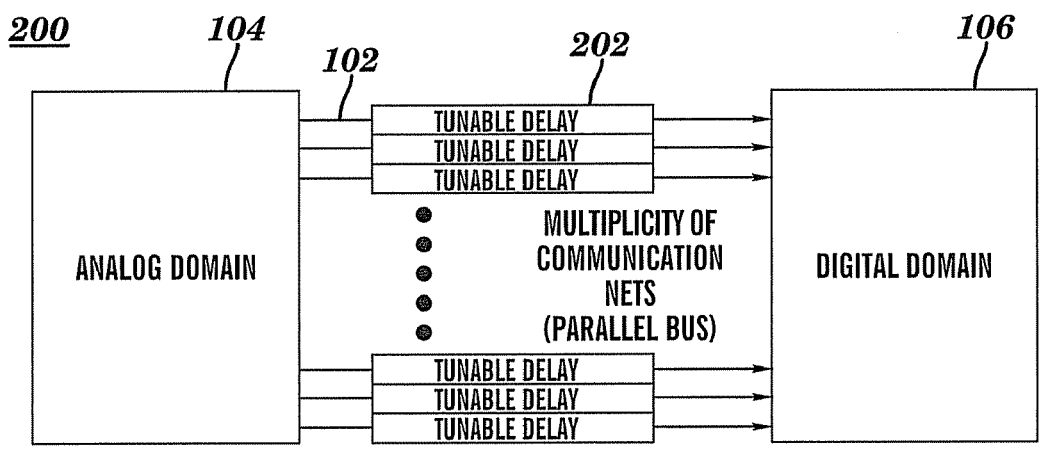
FIG. 2 is a schematic block diagram of a system, wherein each of the multiplicity of parallel communication paths between the analog domain and the digital domain is provided with an independently tunable delay element, in accordance with an embodiment of the invention.
Figure 3A:
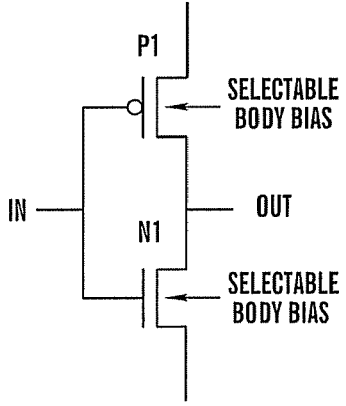
FIG. 3(*a*) is an exemplary a single stage (inverting) CMOS element that may be used as a tunable delay element in the system of FIG. 2.
Figure 3B:
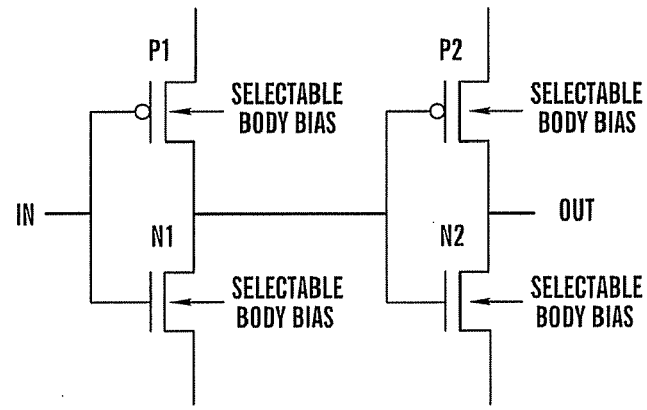

Therefore, in accordance with an embodiment of the invention, FIG. 2 is a schematic block diagram of a system 200, wherein each of the multiplicity of parallel communication paths 102 between the analog domain 104 and the digital domain 106 is provided with an independently tunable delay element 202, the adjustment of which is discussed in further detail hereinafter. Each tunable delay element 202 may include, for example, a single stage CMOS element (invert-ing) as shown in FIG. 3(*a*) or, alternatively, a multistage CMOS element (non-inverting) as shown in FIG. 3(*b*). In still another embodiment, a parallel delay first stage structure may be used to separate rising delay (RDLY) and falling delay (FDLY) tuning, in conjunction with a second combining stage. Regardless of the physical implementation of the tunable delay elements 202, the tuning thereof is carried out by adjustment of the body bias voltage provided to each FET therein.

Figure 4:
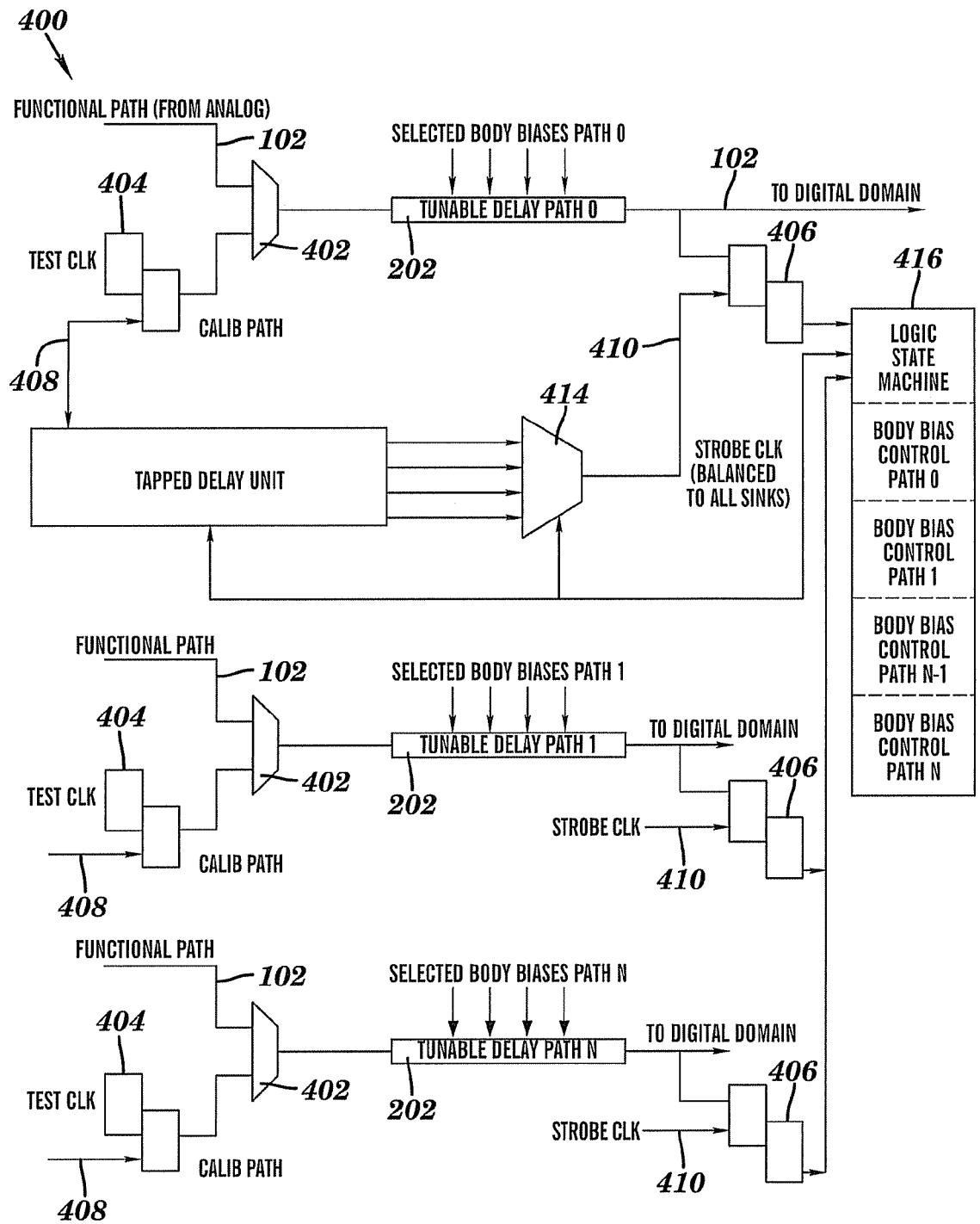
FIG. 4 is a schematic diagram of an exemplary system that may be configured for implementing the balancing of delays within multiple parallel communication paths, in accordance with a further embodiment of the invention.

FIG. 4 is a schematic diagram of an exemplary system 400 that may be configured for implementing the balancing of delays within multiple parallel communication paths (denoted hereinafter as Paths 0 through N). As is shown, the system 400 employs a means of launching data through each of the paths 102 in a test mode, in addition to a means of capturing the data as it exits the path 102 in the test mode. Furthermore, the system 400 utilizes a means of varying the capture time of data, as well as a means of analyzing the path output as compared to an absolute or relative value of arrival time and thereafter making updated adjustments for body bias values in order to converge the delay of one propagation and/or path relative to another.

More specifically, FIG. 4 includes a set of multiplexers 402 for switching the operation of the parallel data paths 102 from a normal operating mode to a test or calibration mode. The calibration of the delay element 202 for the first path (Path 0) is somewhat different from the calibration of the delay elements 202 for the remaining paths (Paths 1-N), as will become more apparent later. However, within each calibration (test) path, there is included a test data launch latch 404 placed on the source side of the communication path 102 (serving as the second input source to corresponding multiplexer 402), and a data capture latch 406 on the sink side of the communication path 102. The launching of the test data in each of the launch latches 404 is controlled by a test clock signal 408, while the receipt of the test data in each of the capture latches 406 is controlled by a strobe clock signal 410, which is tied to the tuning of the first delay element in Path 0.

With regard to calibration of the first delay path (Path 0), a tapped delay unit 412 is used to provide a plurality of discrete, accurate delays, an individual one of which is selectable by multiplexer 414. The output of multiplexer 414 is the strobe clock signal 410. The particular delay selected from tapped delay unit 412 is compared with the delay of test data sent through the calibration path in Path 0, for both rising edge data and falling edge data to see whether the two delays are the same. If not, body bias voltages of the Path 0 delay element 202 are adjusted until RDLY of Path 0 equals FDLY of Path 0.

For example, to test a rising edge delay, initial data values of "1" and "0" are stored in the launch latch 404 and the capture latch 406, respectively. When the test clock launches the "1" data from launch latch 404 to Path 0, the selected strobe clock signal 410 signal generated by the tapped delay unit 412 is simultaneously sent to the capture latch 406. If the selected delay associated with the tapped delay unit 412 is faster than the time taken for the test "1" data to travel through delay Path 0, then the rising edge data change will not be triggered into the capture latch 406. A logic state machine 416 is then used to select the next slowest value of delay from the tapped delay unit 412 and the process is repeated. Eventually, a value of delay from the tapped delay unit 412 will be selected such that the launched "1" data is present at the capture latch 406 by the time the strobe clock signal 410 is received. This will then cause the "0" data initially stored in capture latch 406 to change to "1" data.

Once the specific RDLY of Path 0 is established, the system 400 is further configured to determine the falling edge delay of Path 0 to see if it is the same as RDLY. This time, "0" data is initially stored in launch latch 404, while "1" data is initially stored in capture latch 406. A similar process is used to determine (beginning at the quickest value of tapped delay) which value of tapped delay finally results in the data changing from "1" to "0" in the capture latch 406. The results of the determined FDLY are compared with the determined RDLY, and if they are not the same, the system 400 will implement an adjustment of the body bias of the delay elements of the tunable delay path 0. Once a body bias adjustment is made, the system 400 will allow the RDLY and FDLY determination sequences to be repeated until such time as RDLY equals FDLY for tunable delay path 0. The logic state machine 416 records the selected value of the tapped delay unit 412 for which RDLY and FDLY are equivalent to one another for Path 0.

Tuning of the remaining delay paths (Path 1-N) is then implemented by comparison to the equalized delay values for Path 0. Accordingly, a calibration sequence is next performed for the RDLY and FDLY of Path 1. However, rather than changing the body bias of the delay elements for the purpose of equating RDLY and FDLY in Path 1 to one another, the body biasing for Paths 1-N is adjusted until they are in agreement with Path 0. In other words, rising and falling data is launched through tunable delay test path 1, using the set values for the strobe clock signal 410 determined for Path 0.

At this point, it should be noted that adjustment of the body bias voltages for the various delay elements are may be implemented in any manner known to one skilled in the art, such as through a voltage reference source, a voltage reference multiplier and a voltage divider stack, for example.

Figure 5:
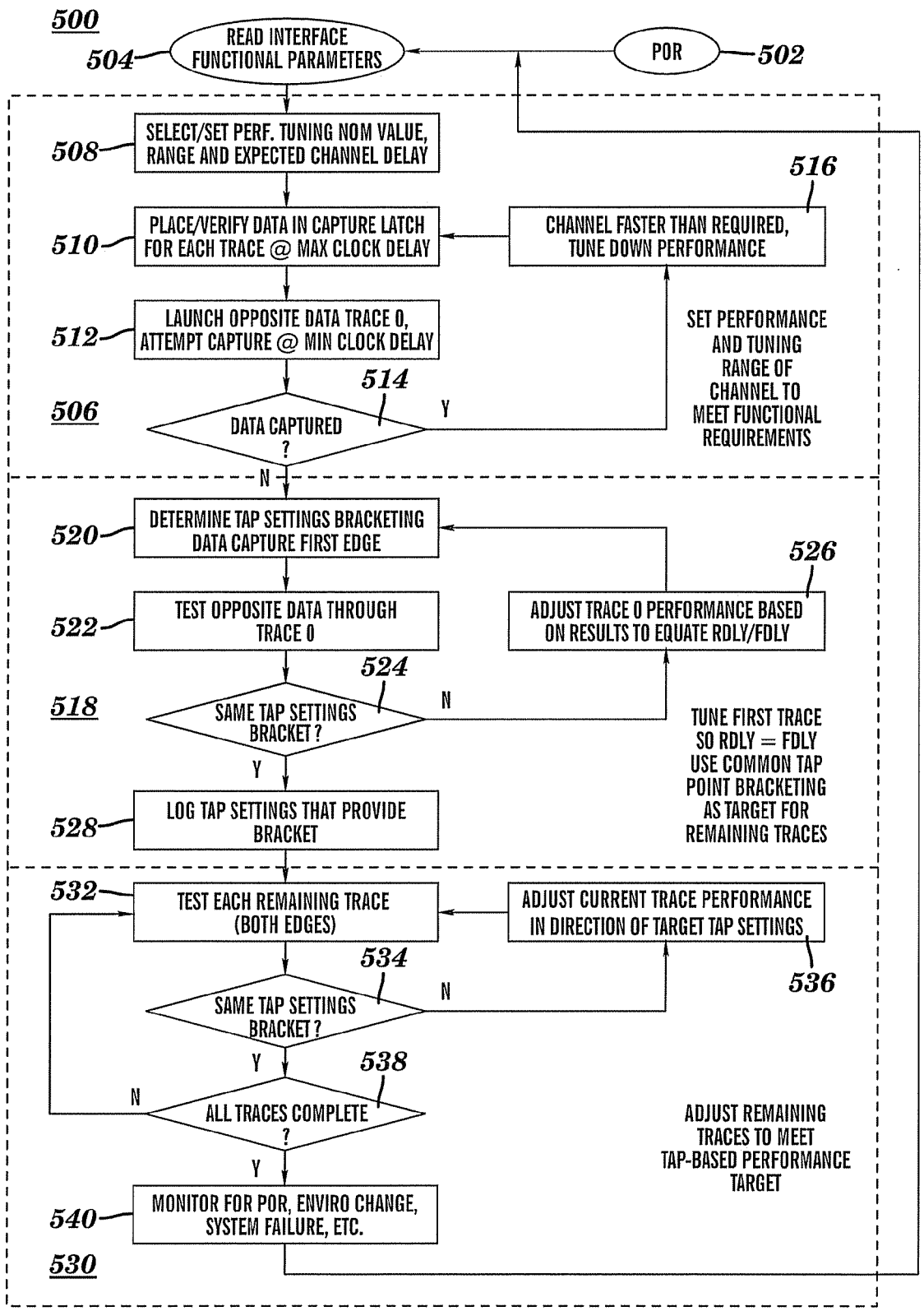
FIG. 5 is a flow diagram illustrating an exemplary methodology for implementing delay path adjustment, in accordance with a further embodiment of the invention.

Finally, FIG. 5 is a flow diagram illustrating an exemplary methodology 500 for implementing delay path adjustment, and which may be carried out, for example, through the use of parallel interface system 400. In an exemplary embodiment, the methodology 500 is launched upon power-on/reset (POR) of the system, as shown at block 502. However, the methodology 500 may be executed or re-executed during other periods of operation, such as during functionally idle periods for example. In this manner, the parallel interface system may maintain a tight delay tolerance while in an operational mode.

Once launched, the methodology 500 reads various functional interface parameters, as shown at block 504, before implementing a first subprocess section 506 thereof, in which the performance and tuning ranges of the parallel data paths are initially set in order to meet functional requirements. For example, as shown in block 508, various nominal tuning values are selected and set, such as initial body bias voltage values. In this regard, an initial setting for the body bias values of the path delay elements may be set at about a midpoint of the capable adjustment range thereof. Furthermore, the initial delay of each of the paths is tested to make sure the delay is not "too small" so as to prevent the ability to tune the same.

More specifically, at block 510, data is placed and verified in the capture latches 406 (FIG. 4) for each path at a maximum clock delay. Then, at block 512, the opposite data is launched to see whether it is captured at the minimum clock delay setting of the tapped delay unit 412. If it is determined at decision block 514 that the data has been captured at this minimum setting, this is indicative that the delay through the associated data path is too small (i.e., the performance of the data path is faster than is needed). In this case, the initial settings of the delay element(s) are tuned to increase the overall delay, as shown at block 516. The initial tuning process is repeated until data is not captured by using the minimum setting of the tapped delay unit 412.

The next subprocess section 518 of methodology 500 implements the tuning of the first delay path, in a manner similar to that discussed in conjunction with the exemplary system 400 of FIG. 4. That is, the delay elements in Path 0 are tuned until RDLY equals FDLY. Proceeding to block 520, the specific tap settings for the tapped delay unit 412 that "bracket" the capture/no capture of the test data in the capture latch 406 (either rising edge or falling edge) are determined. Then, at block 522, the opposite data is passed through Path 0 to see if the same tap settings "bracket" the opposite edge data. If this is not the case, as determined at decision block 524, then the performance (i.e., body bias settings) of Path 0 is adjusted in an attempt to equate RDLY to FDLY, as shown in block 526. The methodology 500 then returns to block 520 to repeat the sequence until RDLY finally equals FDLY, at which time the tap settings are recorded as shown at block 528.

The testing of the remaining paths is outlined in subprocess section 530, beginning at block 532. As indicated earlier, both the rising and falling edge delays of remaining Paths 1-N are not specifically compared with one another, but are instead adjusted to match the RDLY and FDLY of Path 0. Thus, at decision block 534, if the tap settings that establish the RDLY/FDLY for the given path do not match the saved tap settings for Path 0, the methodology 500 advances to block 536 for body bias adjustment of the particular delay path under test. Once the tap settings for the RDLY/FDLY of the path under test match the saved settings for Path 0, then the methodology 500 determines at decision block 538 whether all remaining paths have been tested. If not, the process returns to block 532. Otherwise, the initial tuning of each delay path has been completed. Finally, methodology 500 optionally includes block 540, which causes the entire sequence to be re-run upon detection of another power-on/reset condition, a change in environmental condition or other system failure for example.

It will be appreciated that in addition to the exemplary system architecture 400 and methodology 500 described above, additional features may also be implemented for tuning the delay paths. For example, the architecture 400 may incorporate learning cycles so that the N times methodology flow latency may be included in the total run time of the hardware. Thus, even in non-idle portions of the hardware, the architecture can assume a portion of the available functional bandwidth to insert a learning cycle. Furthermore, a third mode may be added within the structure, adding latches, or using a portion of the learning structure latches to monitor the performance of the system into which the delay path balancing system is incorporated for indications that timing tolerance between the two domains have decreased due to shifts in temperature, voltage or other in-situ stresses. Should degradation of timing tolerances be indicated and functional failure becomes a possibility, a re-calibration methodology flow could be injected to re-optimize the parallel data path well biases for the new in-situ conditions.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A system for balancing signal interconnect path delays between an analog domain and a digital domain of an integrated circuit, comprising:
    a plurality of communication paths between the analog domain and the digital domain, each of said plurality of communication paths including a tunable delay element therein, with a selected one of said communication paths configured for the application of a test signal therethrough;
    means for equalizing a rising edge delay and a falling edge delay of said test signal by adjustment of a body bias voltage of a corresponding one of said tunable delay elements within said selected communication path;
    means for comparing a rising edge delay and a falling edge delay for each of the remaining of said plurality of communication paths with the equalized rising edge delay and falling edge delay of said selected communication path; and
    means for adjusting a body bias voltage for one or more of said tunable delay elements within each of the remaining of said plurality of communication paths until corresponding rising and falling edge delays thereof match said equalized rising edge delay and falling edge delay of said selected communication path.

2. The system of claim 1, further comprising a tapped delay unit configured to generate a plurality individual delay values, wherein a selected value thereof is utilized to determine said rising edge and said falling edge delays of said test signal.

3. The system of claim 2, wherein said selected value of said tapped delay unit is used as a strobe clock signal for capturing data of said test signal, said data launched from a launch latch to a capture latch.

4. The system of claim 3, further comprising a logic state machine, said logic state machine configured for recording bracketed values of said tapped delay unit, said bracketed values comprising a last value of said tapped delay unit that does not result in capturing data of said test signal at said capture latch, and a first value of said tapped delay unit that does result in capturing data of said test signal at said capture latch.

5. The system of claim 4, wherein said rising and falling edge delays of said remaining communication paths are matched to said equalized rising edge delay and falling edge delay of said selected communication path by utilizing said recorded bracketed values of said tapped delay unit.

6. A method of balancing a plurality of communication path delays between an analog domain and a digital domain of an integrated circuit, the method comprising:
    setting nominal tuning values for each of a plurality of delay elements within the plurality of parallel communication paths;
    tuning the delay element for a first of the plurality of communication paths until a rising edge delay of a first test signal sent through the delay element for the first communication path equals a falling edge delay of a second test signal through the delay element for the first communication path; and
    tuning the remaining delay elements for the remaining communication paths so as to match the equalized rising edge delay and falling edge delay of the delay element for the first communication path.

7. The method of claim 6, wherein said tuning the delay element for a first of the plurality of communication paths, and said tuning the remaining delay elements for the remaining communication paths comprises adjusting a body bias voltage thereof.

8. The method of claim 7, further comprising utilizing a selected value of a tapped delay unit to determine said rising edge and said falling edge delays of the delay element for the first communication path.

9. The method of claim 8, wherein the equalized rising edge delay and falling edge delay of the first communication path is stored in a logic state machine by recording bracketed values of said tapped delay unit, said bracketed values comprising a last value of said tapped delay unit that does not result in capturing data of said first and seconds test signals at a capture latch, and a first value of said tapped delay unit that does result in capturing data of said first and second test signal at said capture latch.

10. The method of claim 9, wherein said rising and falling edge delays of said remaining communication paths are matched to said equalized rising edge delay and falling edge delay of said selected communication path by utilizing said recorded bracketed values of said tapped delay unit.

11. The method of claim 8, wherein said setting nominal tuning values for each of the plurality of delay elements further comprises using a minimum value of said tapped delay unit as a strobe clock signal to determine whether test data sent through the plurality delay elements is captured.

12. The method of claim 11, wherein a given one or more of said plurality of delay elements is adjusted whenever said test data sent through the plurality delay elements is captured using said minimum value of said tapped delay unit as a strobe clock signal.

* * * * *